United States Patent [19]
Wu

[11] Patent Number: 5,998,264
[45] Date of Patent: Dec. 7, 1999

[54] METHOD OF FORMING HIGH DENSITY FLASH MEMORIES WITH MIM STRUCTURE

[76] Inventor: Shye-Lin Wu, No. 6, Creation Rd. 2, Science-Based Industrial Park, Hsinchu, Taiwan

[21] Appl. No.: 09/266,552

[22] Filed: Mar. 11, 1999

Related U.S. Application Data

[63] Continuation-in-part of application No. 09/036,027, Mar. 6, 1998.

[51] Int. Cl.[6] .................................................. H01L 21/8247
[52] U.S. Cl. ............................................ 438/260; 438/257
[58] Field of Search ..................................... 438/260, 261, 438/263, 264, 265, 257, 258

[56] References Cited

U.S. PATENT DOCUMENTS

| | | | |
|---|---|---|---|
| 5,352,619 | 10/1994 | Hong | 437/43 |
| 5,460,991 | 10/1995 | Hong | 437/43 |
| 5,472,970 | 12/1995 | Hsue et al. | 437/43 |
| 5,631,482 | 5/1997 | Hong | 257/326 |

OTHER PUBLICATIONS

Yongjoo Jeon et al., Effect of Barrier Layer on the Electrical and Reliability Characteristics of High–k Gate Dielectric films, IEEE, 1998, pp. 797–800.

B. Hc et al., A 1.1 nm Oxide Equivalent Gate Insulator Formed Using $TiO_2$ on Nitrided Silicon, 1998 IEDM, pp. 1038–1040.

Byoung Hun Lee et al., The reliability degradation and thermal stability of reactively sputtered $TiO_2$, no date, 2 pages.

Kevin J. O'Conner et al., A Novel CMOS Compatible Stacked Floating Gate Device using TiN as a Control Gate, 1997 symposium on VLSI Technology Digest of Technical Papers, pp. 61–62.

Youichi Momiyama et al., Ultra–Thin $Ta_2O_5/SiO_2$ Gate Insulator with TiN Gate Technology for 0.1 $\mu$m MOSFETS, 1997 Symposium on VLSI Technology Digest of Technical Papers, pp. 135–136.

Mukesh Kahre et al., Ultra–thin Silicon Nitride Gate Dielectric for Deep–Sub–Micron CMOS Devices, 1997 Symposium on VLSI Technology Digest of Technical Papers, pp. 51–52.

*Primary Examiner*—Donald L. Monin, Jr.
*Assistant Examiner*—Hoai V. Pham
*Attorney, Agent, or Firm*—Harness, Dickey & Pierce, P.L.C.

[57] ABSTRACT

The method of the present invention includes patterning a gate structure. Then, a polyoxide layer is formed on side walls of the gate structure. Then, silicon nitride side wall spacers is formed on the side walls of the gate structure. Then, source/drain structure of the device is fabricated. Next, the side wall spacers is removed to expose a portion of the source and drain. Then, an undoped amorphous silicon layer is formed on the surface of the gate structure, the oxide layer and the exposed source and drain. A dry oxidation process is used to convert the amorphous silicon layer into textured tunnel oxide at the interface of the substrate and the oxide. A polysilicon layer is than formed, followed by chemical mechanical polishing the layer. A conductive layer is formed on the polysilicon layers. Subsequently, a silicon nitride layer deposited by jet vapor deposition (JVD) is formed on the conductive layer. A high k dielectric layer is next formed on the JVD nitride. A conductive layer to serve as control gate is subsequently formed on the high k dielectric layer. A patterning technique is used to pattern the layers.

25 Claims, 4 Drawing Sheets

METHOD OF FORMING HIGH DENSITY FLASH MEMORIES WITH MIM STRUCTURE

This is a continuation-in-part of U.S. patent application Ser. No. 09/036,027, filed Mar. 6, 1998.

FIELD OF THE INVENTION

The present invention relates to a semiconductor device, and more specifically, to a method of fabricating flash memories.

BACKGROUND OF THE INVENTION

Flash memory is one of the segments of nonvolatile memory devices. The device includes a floating gate to store charges and an element for electrically placing charge on and removing the charges from the floating gate. One of the applications of flash memory is BIOS for computer. Typically, the high-density nonvolatile memories can be applied as the mass storage of portable handy terminals, solid state camera and PC cards. That is because that the nonvolatile memories exhibit many advantages, such as a fast access time, low power dissipation, and robustness. The formation of nonvolatile memories toward the trends of low supply power and fast access, because these requirements are necessary for the application of the mobile computing system. One important key parameters of high performance memory is capacitive-coupling ratio. Various nonvolatile memories have been disclosed in the prior art. For example, Mitchellx has proposed EPROMs with self-aligned planar array cell. In this technique, buried diffusion self-aligned to the floating gate avalanche injection MOS transistor are used for the bit lines. Cross point array technology has been disclosed. The self-aligned source and drain will allow this device to be optimized even further for programming speed. See A. T. Mitchellx, "A New Self-Aligned Planar Cell for Ultra High Density EPROMs", IEDM, Tech. pp. 548–553, 1987.

An article proposed by Kevin et al. relates to the formation of the stacked floating gate devices using TiN as a control gate. This is discussed in 1997 Symposium on VLSI Technology Digest of Technical Papers. This structure includes the use of TiN cladding by inserting a high quality oxide between the poly-gate and the TiN cladding. Youichi et al. proposed a structure with $Ta_2O_5/SiO_2$ gate insulator with TiN gate technology. This devices can break through the limitation of a thin $SiO_2$ gate insulator with a poly-Si electrode. The $Ta_2O_5/SiO_2$ structure can provide a stable interface, thus the reliability of the device is improved. In the research, the device will exhibit high drive current and good sub-threshold slope. The $Ta_2O_5/SiO_2$ gate insulator with an equivalent oxide thickness of less than 5 nm. Therefore, it is a proper structure to replace the oxide as the gate insulator for smaller devices. This structure is proposed in 1997 Symposium on VLSI Technology Digest of Technical Papers.

Metal oxide of high dielectric has been researched to take over the silicon dioxide as the gate dielectric. Recently, prior art proposed a $TiO_2$ film as a gate dielectric to replace the oxide. JVD nitride layer, which refers to the nitride formed by jet vapor deposition, is used as an under layer of $TiO_2$ for MIS (metal-insulator-silicon) structure. Typically, the interfacial layer is a serious issue of the metal oxide dielectric layer formed on the silicon material. The effective dielectric constant of the MIS capacitor is degraded due to the interfacial layer. The main reason for forming the interfacial layer is in the initial step of deposition. A research in IEDM, proposed by B. He et al., p. 1038 (1998), entitled "A 1.1 nm Oxide Equivalent Gate Insulator Formed Using on $TiO_2$ Nitride Silicon". B. He et al., has approached that there exist an inter diffusion problem between the silicon and high k dielectric layer. During the annealing, inter-diffusion of Si, Ti and O occurred. The interfacial layer consists of $Ti_xSi_yO_z$. Thus, a barrier layer is needed in the metal/high k/Si (MIS) structure to overcome the inter diffusion problem. The JVD nitride is an effect barrier layer to suppress the inter diffusion problem. Please refer to a further article "Effect of Barrier Layer on the Electrical and Reliability Characteristic of High-k Gate Dielectric films", IEEE, 1998, Yongjoo et al., p. 797. The use of JVD as an oxidation barrier can obtain thin equivalent oxide thickness (ETO). As known in the art, the interfacial layer increases ETO and the inter-diffusion causes the trap generation. In the paper of Yongjoo, it mentioned that ETO of $TiO_2$/JVD nitride/Si structure is thinner than the $TiO_2$/Si structure. Thus, the JVD nitride is an effect barrier layer to suppress the formation of interfacial layer.

Furthermore, the nitride made by the JVD exhibits excellent electrical properties. The JVD nitride has lower leakage current than the one of oxide and it has high resistant to boron penetration. Please refer to an article entitled "Ultra-thin Silicon Nitride Gate Dielectric for Deep-Sub-Micron CMOS Device", Mukesh Khare et al., 1997 Symposium on VLSI Technology Digest of Technical Papers.

SUMMARY OF THE INVENTION

The method of the present invention includes forming a gate oxide layer on a substrate. Subsequently, a doped polysilicon layer is deposited on the gate oxide layer. Then, a silicon nitride layer is deposited on the polysilicon layer to improve the resolution of lithography. An etching step is used to etch the silicon nitride layer, polysilicon layer and gate oxide for forming a gate structure. A dielectric layer is formed on the substrate. Then, a polyoxide layer is simultaneously formed on side walls of the gate structure in the procedure.

Then, a silicon nitride layer is formed on the surface of the substrate. Successively, the dielectric layer is etched back to form side wall spacers on the side walls of the gate structure. Thus, only the portions of the oxide under the side wall spacers are left. The source/drain structure of the device is fabricated using conventional masking and ion implantation steps. A high temperature oxidation is performed to drive dopants deeper into the substrate.

The next step is to remove the side wall spacers and the oxide layer to expose a portion of the source and drain. The silicon nitride layer and polyoxide layer are also stripped, thereby exposing the gate structure. Then, an undoped amorphous silicon layer is formed on the surface of the gate structure, the oxide layer and the exposed source and drain. A dry oxidation process is used to convert the amorphous silicon layer into textured tunnel oxide at the interface of the substrate and the oxide. Next, a polysilicon layer is deposited on the patterned polysilicon and the oxide layer. Subsequently, a chemical mechanical polishing (CMP) technique is used to polish the polysilicon layer. The oxide at the top of the gate is removed during the CMP process.

A conductive layer is formed on the polysilicon layers. The conductive layer can be selected from the group of TiN, WN, or TaN. Subsequently, a silicon nitride layer deposited by jet vapor deposition (JVD) is formed on the conductive layer. The silicon nitride is formed by jet vapor system. In a preferred embodiment, the thickness of the JVD nitride is about 10 to 50 angstroms. A dielectric layer is next formed on the JVD nitride to serve as the high k dielectric layer between the subsequent control gate and floating gate. The $TiO_2$, $Ta_2O_5$, $Al_2O_3$, $Y_2O_3$, BST and PZT are the material used for the present invention. Preferably, the $TiO_2$ is the preferred choice to act the high k dielectric layer. A conductive layer to serve as control gate is subsequently formed on the high k dielectric layer. The TiN, WN, TaN, Ti, W, Pt etc. can be used as the control gate. Finally, a patterning technique including lithography and etching processes is used to pattern the layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
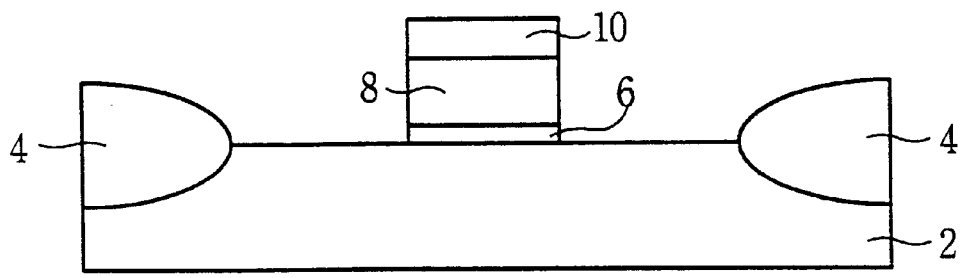
FIG. 1 is a cross sectional view of a semiconductor wafer illustrating the steps of forming a gate structure on a semiconductor substrate according to the present invention.

In the present invention, a metal-insulator-metal (MIM) structure is used. The present invention proposes a novel method to fabricate a high density flash nonvolatile memory with high capacitive-coupling ratio and high speed operation.

In the method, an undoped hemispherical grained silicon (HSG-Si) or amorphous silicon will be used to form a textured tunneling oxide to enhance the electron tunneling efficiency. The structure can increase the device operation speed. The textured structure is constructed by the rapid diffusion of oxygen through the grain boundaries of the silicon film into silicon substrate. Furthermore, silicon nitride formed by jet vapor system is also introduced in the application as gate dielectric and inter metal dielectric. The floating gate uses TiN as a control gate. The detailed description will be seen as follows.

A semiconductor substrate is provided for the present invention. In a preferred embodiment, as shown in the FIG. 1, a single crystal silicon substrate 2 with a <100> crystallographic orientation is provided. A plurality of isolations 4 between devices are formed on the substrate 2. In general, field oxide (FOX) isolation or shallow trench isolation techniques can be introduced to serve as the isolations 4. For example, the FOX regions 4 can be formed via lithography and etching steps to etch a silicon nitride/silicon dioxide composition layer. After the photoresist is removed and wet cleaned, thermal oxidation in steam environment is used to grow the FOX regions 4. As known in the art, a shallow trench isolation technique can be used to replace the FOX.

A thin gate oxide layer 6 consisted of silicon oxide is formed on the substrate 2. Typically, the gate oxide 6 can be grown in $O_2$, $N_2O$, NO or $N_2+O_2$ ambient at a temperature of about 700 to 1100 degrees centigrade. Other method, such as chemical vapor deposition, can also form the gate oxide 6. In the embodiment, the thickness of the silicon dioxide layer 6 is approximately 15–250 angstroms. In addition, ultra thin silicon nitride formed by jet vapor deposition (JVD) can be selected as the gate dielectric. The JVD nitride exhibit excellent electrical properties. Compared to thermal oxide, the JVD nitride has a lower leakage current and higher resistant to boron penetration. The JVD nitride can be deposited at room temperature using JVD technique, followed by annealing at about 800 to 850 centigrade degrees.

Subsequently, an n+ doped polysilicon layer 8 is deposited on the gate oxide layer 6. The n+ doped polysilicon layer 8 can be doped by phosphorus using a $PH_3$ source. Then, a silicon nitride layer ($SiN_x$) 10 is deposited on the polysilicon layer 8 for acting as an anti-reflective coating (ARC) layer to improve the resolution of lithography. Any suitable process can be used to form the silicon nitride layer 10. As known by a person of ordinary skills in the art, the silicon nitride layer 10 can be formed using Low Pressure Chemical Vapor Deposition (LPCVD), Plasma Enhance Chemical Vapor Deposition (PECVD), and so on. Further, the temperature forming the silicon nitride layer 10 is at a range of 300–800 degrees centigrade. In the preferred embodiment, the reaction gases of the step to form silicon nitride layer 10 are $SiH_4$, $NH_3$, $N_2$, $N_2O$ or $SiH_2Cl_2$, $NH_3$, $N_2$, $N_2O$.

Next, still referring to FIG. 1, standard lithography and etching steps are used to etch the silicon nitride layer 10, polysilicon layer 8 and gate oxide 6 to the surface of the substrate 2 for forming a gate structure.

Figure 2:
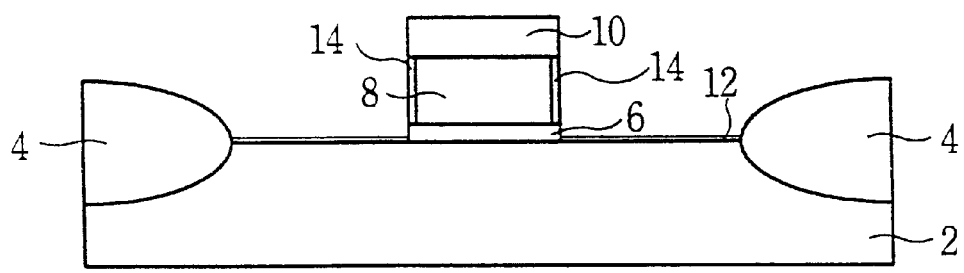
FIG. 2 is a cross sectional view of a semiconductor wafer illustrating the step of forming polyoxide according to the present invention.

Turning to FIG. 2, subsequently, an ultra thin dielectric layer, such as silicon oxynitride layer 12, is formed on the substrate 2 where is exposed by the gate structure. In a case, the silicon oxide layer 12 is formed by thermal oxidation in $N_2O$ or NO environment. This can also be done in $N_2$ and $O_2$ ambient. The temperature for forming the silicon oxide layer 12 ranges from 700 to 1150 degrees centigrade. The thickness is preferably about 25 to 150 angstroms. Further, a polyoxide layer 14 is simultaneously formed on side walls of the gate structure in the procedure.

Figure 3:
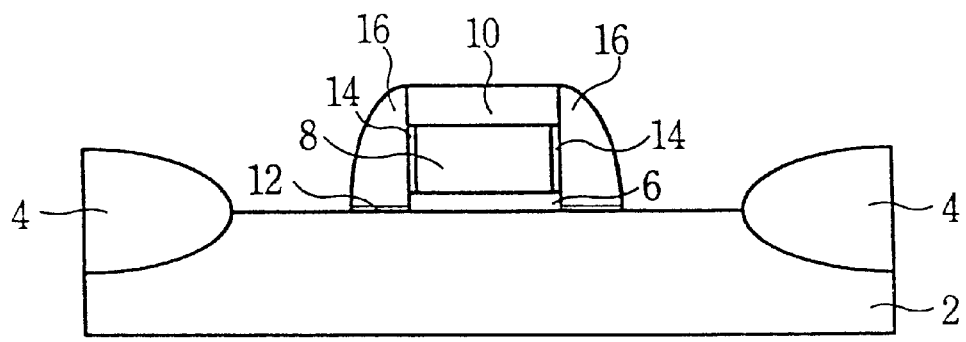
FIG. 3 is a cross sectional view of a semiconductor wafer illustrating the step of forming silicon nitride side wall spacers according to the present invention.

Then, side wall spacers 16 are formed on the side walls of the gate structure for isolating, as shown in FIG. 3. In order to achieve this, a dielectric layer, such as silicon nitride layer, is formed on the surface of the substrate 2 and along a surface of the gate structure. Successively, the dielectric layer is anisotropically etched by using an anisotropical etching process to construct the side wall spacers 16. In a case, the dielectric layer can be formed of silicon nitride layer, which is formed by using aforesaid method. Thus, only the portions of the oxide 12 under the side wall spacers 16 are left and adjacent to the gate oxide 6.

Figure 4:
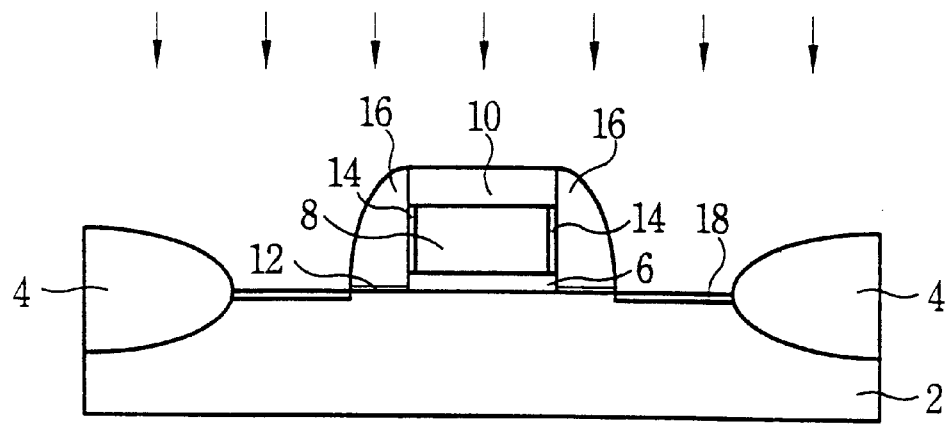
FIG. 4 is a cross sectional view of a semiconductor wafer illustrating the step of forming source and drain according to the present invention.

The source/drain structure of the device may now be fabricated using conventional masking and ion implantation steps. Please turn to FIG. 4. An ion implantation is carried out to dope dopants into the substrate 2 by using the gate structure and side wall spacers 16 as a mask. In this step, a buried conductive diffusion layer 18 is formed in the substrate 2 adjacent to the gate structure to serve as source and drain. For example, n type conductive dopants may be used for the implantation. The source and drain 18 are formed by a conventional ion implantation with n conductive type dopants such as phosphorus or arsenic at a dose about 2E15 to 5E16 atoms/cm$^2$, and an energy is about 0.5 to 120 KeV. It should be well understood by those skill in the art that a p type conductive dopants could be used by simply substituting opposite dopants to those given for the aforesaid step.

Figure 5:
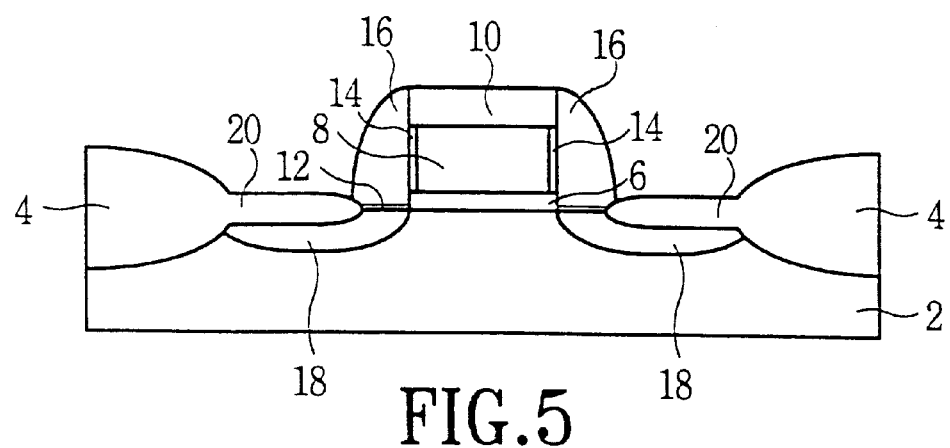
FIG. 5 is a cross sectional view of a semiconductor wafer illustrating the step of performing a thermal process to drive the dopants into the substrate according to the present invention.

Turning to FIG. 5, a high temperature oxidation is performed to drive dopants deeper into the substrate 2. In the same time, an oxide layer 20 having a thickness about 500 to 2000 angstroms is grown on the top of the source and drain 18 that are exposed by the gate structure and the isolating spacers 16.

Figure 6:
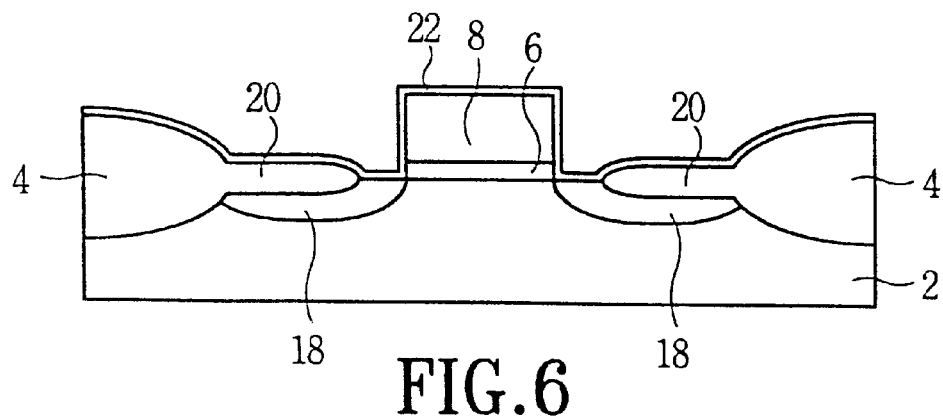
FIG. 6 is a cross sectional view of a semiconductor wafer illustrating the steps of forming an amorphous silicon layer according to the present invention.

Turning to FIG. 6, the following step is to remove the side wall spacers 16 and the silicon nitride layer 10. The oxide layer 12 that is uncovered by the gate and the polyoxide layer 14 are then stripped, thereby exposing the gate structure and expose a portion of the source and drain 18. In the embodiment, the silicon nitride can be removed by using hot phosphorus acid solution. Using HF solution or BOE (buffer oxide etching) solution can strip the oxide layer. Then, an undoped thin amorphous silicon layer 22 is formed on the surface of the gate structure, the oxide layer 20 and the exposed source and drain 18. The thickness of the undoped amorphous silicon layer 22 is about 20 to 200 angstroms. Further, hemispherical grained silicon (HSG-Si) can be used to replace the amorphous silicon layer 22. The amorphous silicon 22 is formed in a furnace at about 400 to 600 degrees centigrade in an ambient containing $SiH_4/N_2$.

Figure 7:
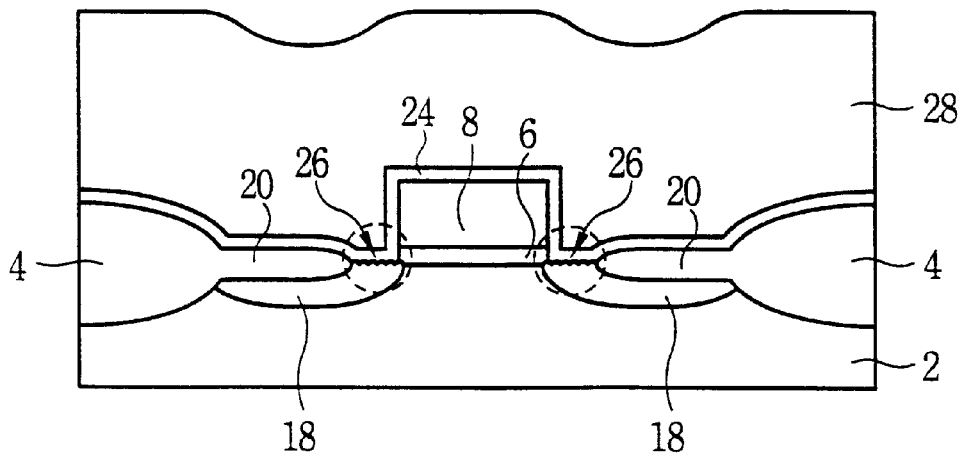
FIG. 7 is a cross sectional view of a semiconductor wafer illustrating the steps of forming a textured tunneling oxide and a further polysilicon layer according to the present invention.

Turning to FIG. 7, a dry oxidation process is introduced at 700 to 1000 degrees centigrade in $O_2$ ambient to convert the amorphous silicon layer 22 into textured tunnel oxide 24 with textured profile 26 at the interface of the substrate 2 and the oxide 24. This structure is referred to TOPS (thermally oxidizing a polysilicon film on silicon substrate). The mechanism of forming the textured structure is the rapid diffusion of oxygen through the grain boundaries of the silicon film into silicon substrate 2 and the enhanced oxidation rate at the grain boundaries. Therefore, a textured silicon/oxide interface is achieved. The textured interface 26 results in localized high fields and enhances the electron injection into TOPS. The tunneling oxide 24 having textured interface 26 has a higher electron conduction efficiency and lower electron trapping rate. This can refer to an article proposed by S. L. Wu, "Characterization of Thin Textured Tunnel Oxide Prepared by Thermal Oxidation of Thin Polysilicon Film on Silicon", IEEE, Trans. Electron Devices, vol. ED-43, pp. 287–294, 1996.

The present invention has high capacitive-coupling ratio due to the extended area of the floating gate, therefor it can be used for low power operation. Further, the present invention exhibits high speed and low power operation due to the high electron injection efficiency of textured tunnel oxide. The read or write speed is higher than the conventional structure in read, and write modes. Next, another n+doped polysilicon layer 28 is deposited on the patterned polysilicon 8 and the layer 24.

Figure 8:
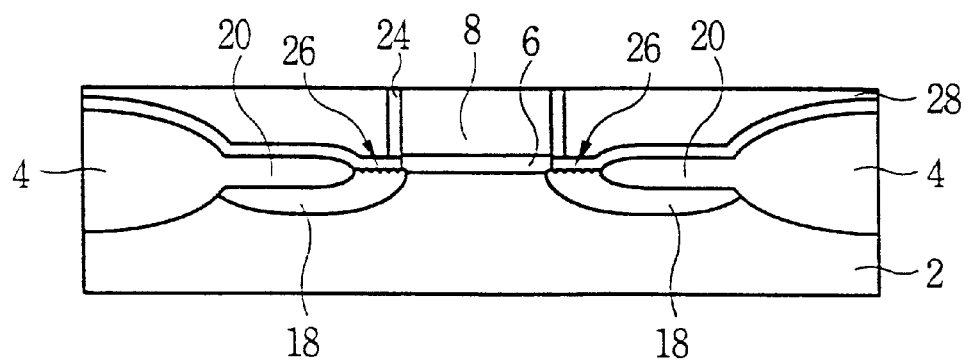
FIG. 8 is a cross sectional view of a semiconductor wafer illustrating the step of performing a chemical mechanical polishing to polish the polysilicon layer the according to the present invention.
Figure 9:
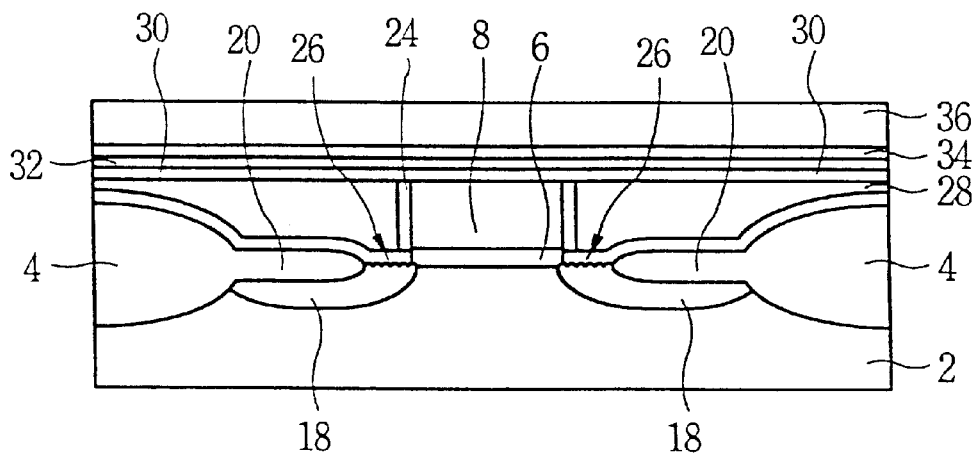
FIG. 9 is a cross sectional view of a semiconductor wafer illustrating the step of forming a multi-level metal structure according to the present invention.
Figure 10:
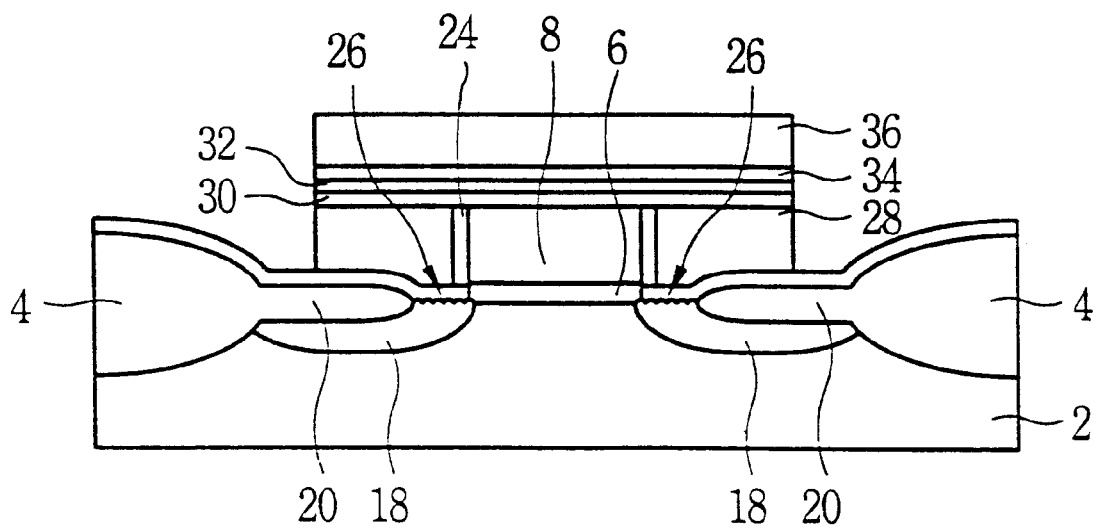
FIG. 10 is a cross sectional view of a semiconductor wafer illustrating the step of defining the gate according to the present invention.

As shown in FIG. 8, subsequently, a chemical mechanical polishing (CMP) technique is used to polish a portion of the polysilicon layer 28. The oxide 24 at the top of the gate 8 is also removed during the CMP process, as shown in the scheme. The polysilicon layer 28 is separated into two parts adjacent to said gate structure in a cross-sectional view. A conductive structure is established to connect these parts and further to increase the surface of the subsequent floating gate. One of the methods to obtain the benefit is to form a conductive layer 30, preferably nitride base metal compound, on the polysilicon layers 8 and 28. For example, the conductive layer can be selected from the group of TiN, WN, TaN or n+doped silicon to act as the conductive layer 30 as shown in FIG. 9. Thus, the floating gate is consisted of the gate 8, the polysilicon layer 28 and the layer 30.

Subsequently, a silicon nitride layer 32 deposited by jet vapor deposition (JVD) is formed on the conductive layer 30 as a barrier. The silicon nitride formed by jet vapor system is referred to JVD nitride herein. In a preferred embodiment, the thickness of the JVD nitride is about 10 to 50 angstroms. A dielectric layer 34 is next formed on the JVD nitride 32 to serve as the high k dielectric layer between the subsequent control gate and floating gate. The $TiO_2$, $Ta_2O_5$, $Al_2O_3$, $Y_2O_3$, BST and PZT are the material used for the present invention. Preferably, the $TiO_2$ is the preferred choice to act the high k dielectric layer. The $TiO_2$ is a promising material to be a gate insulator on silicon nitride. An inter diffusion problem may be occurred between the silicon and high k dielectric layer. Thus, a barrier layer is needed in the metal/high k/Si (MIS) structure to overcome the inter-diffusion problem. The JVD nitride is an effect barrier layer to suppress the inter-diffusion problem. Please refer to an article "Effect of Barrier Layer on the Electrical and Reliability Characteristic of High-k Gate Dielectric films", IEEE, 1998, Yongjoo et al., p. 797.

A conductive layer 36 to serve as control gate is subsequently formed on the high k dielectric layer 34. The TiN, WN, TaN, Ti, W, Pt can be used as the control gate. The $Ta_2O_5$ and TiN are promising candidates for gate insulator and gate electrode, respectively. The $Ta_2O_5$ with a TiN gate will break the limitation of the oxide insulator with polysilicon gate. Finally, a patterning technique including lithography and etching processes is used to pattern the layers, thereby forming the devices.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a nonvolatile memory on a semiconductor substrate, said method comprising the steps of:

forming a gate dielectric layer on said semiconductor substrate;

forming a first polysilicon layer on said gate dielectric;

forming a silicon nitride layer on said first polysilicon layer;

patterning said silicon nitride layer, said first polysilicon layer and said gate dielectric layer to form a gate structure on said semiconductor substrate;

performed a first thermal oxidation to form a first oxide layer on said semiconductor substrate exposed by said gate structure and simultaneously form a polyoxide layer on side walls of said gate structure;

forming an isolating spacers on side walls of said gate structure;

performing an ion implantation to form source and drain of said nonvolatile memory in said semiconductor substrate;

performing a second thermal oxidation to form a second oxide layer on said semiconductor substrate exposed by said gate structure and said isolating spacers, wherein the dopants of said first ion implantation being driven into said semiconductor substrate;

removing said silicon nitride layer, said isolating spacers, then removing said polyoxide layer and said gate dielectric that is uncovered by said gate structure;

forming an undoped silicon layer along a surface of said gate structure and said second oxide layer;

performing a third thermal oxidation to convert said undoped silicon layer into a third oxide layer having textured interface between said semiconductor substrate and said third oxide layer;

forming a second polysilicon layer on said third oxide layer;

performing a chemical mechanical polishing to polish a portion of said second polysilicon layer and the top of said third oxide on said gate structure thereby exposing said gate structure, wherein said second polysilicon is separated into two parts adjacent to said gate structure in a cross-sectional view;

forming a metal-insulator-metal (MIM) structure on said polished second polysilicon layer and on said gate structure, wherein said metal-insulator-metal structure includes a first conductive layer on said polished second polysilicon layer and on said gate structure, an insulator layer on said first conductive layer, a second conductive layer on said insulator layer, said polished polysilicon layer and said gate structure and said first conductive layer are used as a floating gate, wherein said second conductive layer as control gate.

2. The method of claim 1, further comprising the step of forming said insulating layer:

forming a barrier on said first conductive layer; and forming a dielectric layer.

3. The method of claim 2, wherein said barrier layer comprises a silicon nitride formed by jet vapor deposition.

4. The method of claim 2, wherein said dielectric layer comprises the material selected from $TiO_2$, $Ta_2O_5$, $Al_2O_3$, BST $Y_2O_3$, or PZT.

5. The method of claim 1, wherein said first conductive layer comprises the material selected from TiN, WN, TaN or n+ doped silicon.

6. The method of claim 1, wherein said second conductive layer comprises the material selected from TiN, WN, TaN, Ti, W, Pt.

7. The method of claim 1, wherein said isolating spacers are composed of silicon nitride.

8. The method of claim 1, wherein said first thermal oxidation is performed in $N_2O$ ambient.

9. The method of claim 1, wherein said first thermal oxidation is performed in NO ambient.

10. The method of claim 1, wherein said first thermal oxidation is performed in $N_2$ and $O_2$ ambient.

11. The method of claim 1, wherein said first thermal oxidation is performed at a temperature about 700 to 1150 degrees centigrade.

12. The method of claim 1, wherein said isolating spacers are removed by using hot phosphorus acid solution.

13. The method of claim 1, wherein said silicon nitride layer is removed by using hot phosphorus acid solution.

14. The method of claim 1, wherein said polyoxide layer is removed by using HF solution or BOE solution.

15. The method of claim 1, wherein said gate dielectric is removed by using HF solution or BOE solution.

16. The method of claim 1, wherein said third thermal oxidation comprises dry oxidation.

17. The method of claim 11, wherein said third thermal oxidation is performed in $O_2$ ambient.

18. The method of claim 11, wherein said third thermal oxidation is performed at a temperature about 700 to 1000 degrees centigrade.

19. The method of claim 1, wherein said undoped silicon layer comprises amorphous silicon.

20. The method of claim 1, wherein said undoped silicon layer comprises hemispherical grained silicon.

21. The method of claim 19, wherein said amorphous silicon is formed at a temperature about 400 to 600 degrees centigrade.

22. The method of claim 19, wherein said amorphous silicon is formed in an ambient containing $SiH_4/N_2$.

23. The method of claim 19, wherein said amorphous silicon is formed to have a thickness about 20 to 100 angstroms.

24. The method of claim 1, wherein said gate dielectric layer comprises oxide.

25. The method of claim 1, wherein said gate dielectric layer comprises silicon nitride formed by jet vapor deposition.

* * * * *